United States Patent
Gupta

(10) Patent No.: US 8,196,017 B1
(45) Date of Patent: Jun. 5, 2012

(54) METHOD FOR ON-THE-FLY ERROR CORRECTION IN A CONTENT ADDRESSABLE MEMORY(CAM) AND DEVICE THEREFOR

(75) Inventor: Pankaj Gupta, Palo Alto, CA (US)

(73) Assignee: NetLogic Microsystems, Inc., Irvine, CA (US)

( * ) Notice: Subject to any disclaimer, the term of this patent is extended or adjusted under 35 U.S.C. 154(b) by 1245 days.

(21) Appl. No.: 11/983,382

(22) Filed: Nov. 7, 2007

Related U.S. Application Data

(62) Division of application No. 11/043,391, filed on Jan. 25, 2005, now Pat. No. 7,304,873.

(51) Int. Cl.
*G11C 29/00* (2006.01)

(52) U.S. Cl. ............... 714/763; 714/108; 714/54

(58) Field of Classification Search ........... 714/763, 714/108, 54, 42, 43, 6
See application file for complete search history.

(56) References Cited

U.S. PATENT DOCUMENTS

| | | | |
|---|---|---|---|
| 6,560,156 B2 | 5/2003 | Lien et al. ............ 365/222 |
| 6,597,595 B1 | 7/2003 | Ichiriu et al. ......... 365/49 |
| 6,690,595 B1 | 2/2004 | Srinivasan et al. ..... 365/49 |
| 6,700,810 B1 | 3/2004 | Ichiriu et al. ......... 365/49 |
| 6,700,827 B2 | 3/2004 | Lien et al. ............ 365/222 |
| 6,707,693 B1 | 3/2004 | Ichiriu ................ 365/49 |
| 6,728,124 B1 | 4/2004 | Ichiriu et al. ......... 365/49 |
| 6,903,953 B2 * | 6/2005 | Khanna ............... 365/49.17 |
| 6,914,795 B1 | 7/2005 | Srinivasan et al. ..... 365/49 |
| 6,978,343 B1 | 12/2005 | Ichiriu ............... 711/108 |
| 6,987,684 B1 * | 1/2006 | Branth et al. ......... 365/49.17 |
| 7,002,823 B1 | 2/2006 | Ichiriu ............... 365/49 |
| 7,043,673 B1 | 5/2006 | Ichiriu et al. ......... 714/719 |
| 7,099,584 B1 | 8/2006 | Narvaez et al. ........ 398/58 |
| 7,237,156 B1 | 6/2007 | Srinivasan et al. ..... 714/719 |
| 7,237,172 B2 * | 6/2007 | Regev et al. .......... 714/754 |
| 7,254,748 B1 | 8/2007 | Wright et al. ......... 714/43 |
| 7,257,763 B1 | 8/2007 | Srinivasan et al. ..... 714/764 |
| 7,283,380 B1 | 10/2007 | Srinivasan et al. ..... 365/49 |
| 7,304,873 B1 | 12/2007 | Gupta ................ 365/49 |
| 7,522,592 B2 * | 4/2009 | Kanetake et al. ...... 370/389 |
| 2005/0010719 A1 | 1/2005 | Slavin ............... 711/108 |

* cited by examiner

*Primary Examiner* — Fritz Alphonse
(74) *Attorney, Agent, or Firm* — Sterne, Kessler, Goldstein & Fox PLLC

(57) ABSTRACT

A CAM system (200) can include a number of entries (202-0 to 202-3) having one portion for storing a data value (e.g., E1) and another portion for storing a replicated data value (E1 (REP)). For on-the-fly error correction, the entries can be searched by applying an appended key value that includes a key portion (KEY) and replicated key portion (KEY(REP)).

23 Claims, 13 Drawing Sheets

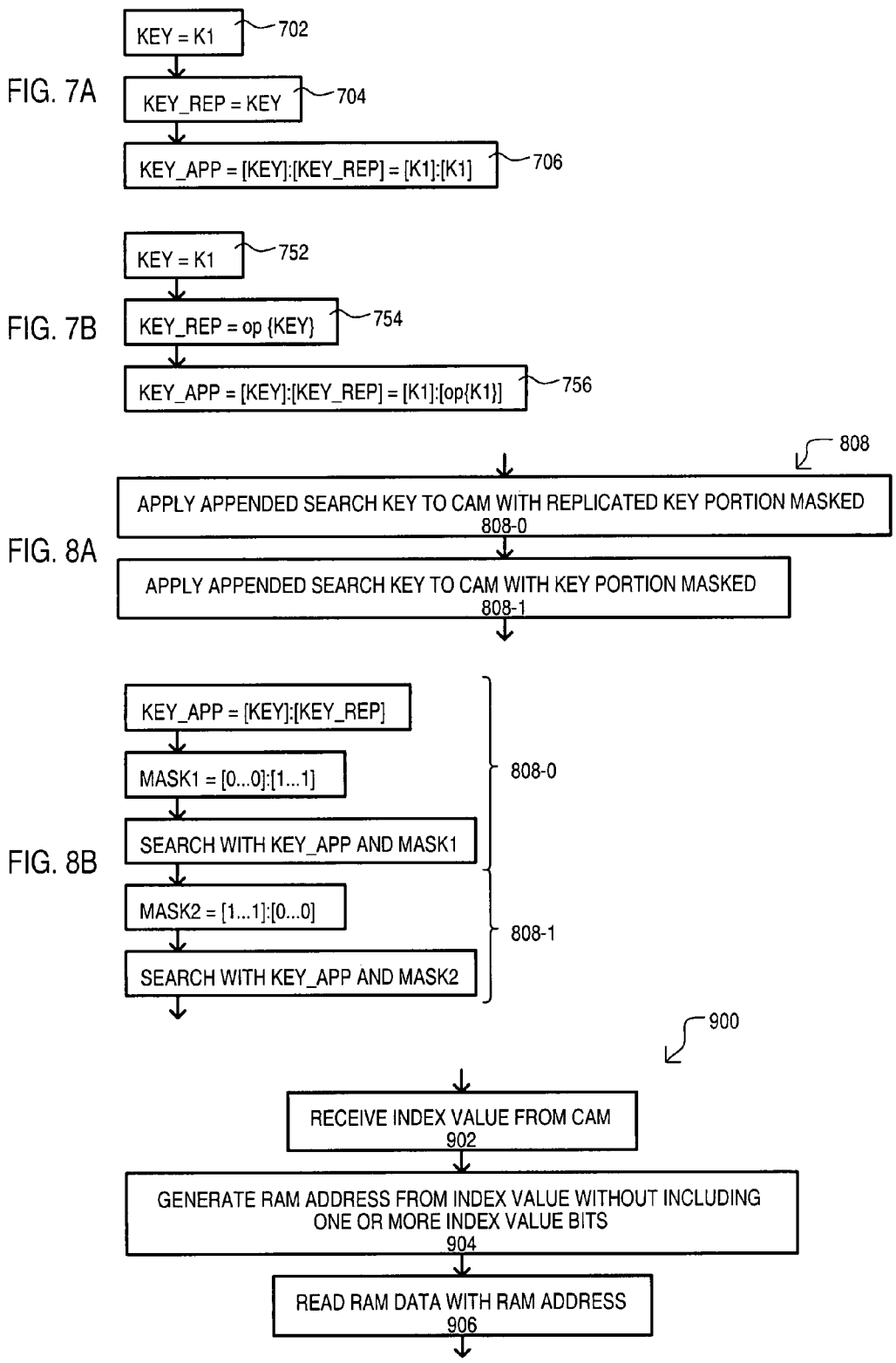

METHOD FOR ON-THE-FLY ERROR CORRECTION IN A CONTENT ADDRESSABLE MEMORY(CAM) AND DEVICE THEREFOR

This application is a divisional of U.S. patent application Ser. No. 11/043,391 filed on Jan. 25, 2005 by Pankaj Gupta, now U.S. Pat. No. 7,304,873, issued on Dec. 4, 2007, the contents of which are incorporated by reference herein.

TECHNICAL FIELD

The present invention relates generally to content addressable memory (CAM) devices, and more particularly to devices and methods for error correction in CAM devices.

BACKGROUND OF THE INVENTION

Electronic components, such as semiconductor memory devices, can provide very rapid, highly compact memory and related functions. However, due to uncontrollable events such devices can generate errors. While manufacturing defects, such as those resulting from uncontrollable process variation, particles and the like, are often readily addressed by redundancy techniques, other types of errors can be more difficult to address.

As but one example, a memory device suffering from no manufacturing defects may still be subject to "soft" errors. Soft errors are most often attributed, either directly or indirectly, to sub-atomic particles traveling through a semiconductor substrate and generating electron hole pairs. Such electron hole pairs can cause a change in state of the data stored within a memory device. Soft errors can become particularly problematic as semiconductor device sizes continue to shrink in size.

To address errors arising from undesirable changes in data values, error correction techniques are known and have been proposed for conventional memory devices, such as dynamic random access memories (DRAMs), static RAMs (SRAMs), and various ROM type memories (EPROMs, EEPROMs and "flash" EEPROMs).

It is noted that the term "error-correction" as used herein, refers to the ability to return correct data values/result (in the event errors exist in stored data values) on every read operation (and also for every search operation in the case of TCAMs). Erroneous data present within a memory device can be corrected according to various techniques well known to those skilled in the art. For example, one conventional approach to addressing errors in stored data values can be to store a corrected data value in temporary storage and find an empty cycle to write it back to the memory location containing an erroneous value.

To better understand various features of the disclosed embodiments, a conventional technique for providing error-correction in an SRAM device will be described with reference to FIG. 19. FIG. 19 is a block diagram showing a packet processing system 1900 that includes a packet processor 1902 and an associated SRAM 1904. Within SRAM 1904 each addressable location can store both a data value 1906-0 as well as a corresponding error correction code (ECC). According to well-understood techniques an error correction code can be generated by applying a function to the data value 1906-0.

In an SRAM read operation, an address "addr" can be applied by an SRAM controller within packet processor 1902 to SRAM 1904 to thereby read data from an addressable location. In response, SRAM 1904 can output both a data value and ECC value "data, ecc" (e.g., 1906-0 and 1906-1). For example, error correction logic within an SRAM controller of packet processor 1904 can perform 1-bit correction and 2-bit detection of errors in the read data utilizing the ECC bits.

A resulting corrected (if necessary) data value can be returned to an entity (such as a processor thread being executed by packet processor 1902) that requested the data from the SRAM 1904. Such error correction can be considered "on-the-fly" error correction, as the data is corrected on the fly as it is read.

While the above conventional approach can provide fast error correction in an SRAM, such an approach can present problems if attempted with a content addressable memory (CAM). This is because of the intrinsic nature of the operation of CAM as will be described now in conjunction with FIG. 20.

FIG. 20 shows a packet processing system 2000 that includes a packet processor 2002 and an associated CAM 2004. Within CAM 2004, each addressable location (e.g., entry) stores both a data value 2006-0 as well as a corresponding ECC value 2006-1.

When a key is searched in a CAM 2004, all entries in the CAM 2004 can be searched, and the result output can be either a "miss", or a "hit" along with the index of a best matching entry "index". That is, in a search operation, data values for all searched CAM entries are accessed for comparison with a key value. This is quite different from the SRAM case in which a single address is accessed.

Furthermore, unlike SRAM entries, CAM entries can present two different types of errors. As is well understood, in a search operation, a CAM entry can generate a hit (all bits match a key) or a miss (one or more bits do not match the key). If a CAM entry includes one or more errors, it can generate not only a "false miss" (one or more bits erroneously force a mis-match) but also a "false hit" (one or more bits erroneously force a match).

As a result, in the case of a CAM 2004, if even one searched entry anywhere in the CAM has a soft error, it can affect a final result output. Thus, if on-the-fly error correction for a search operation is desired, such a conventional arrangement would require that all searched entries are checked (and corrected) according to their respective ECC bits for every search. This is prohibitively expensive since each CAM row is designed and placed carefully to optimize layout and density, and an ECC operation (which needs access to all bits for its operation) could destroy the carefully placed arrangement of CAM cells.

Consequently, approaches like that for the SRAM shown in FIG. 19 are not suitable for providing SRAM-like on-the-fly error correction for a CAM.

Three general conventional approaches to error handling in CAMs are known.

In a first conventional approach, on-the-fly error correction is abandoned entirely. Instead, error detection or correction is performed in the "background" of the normal CAM operations, utilizing a software or hardware scan. In this scheme, ECC bits are kept with each CAM entry, and every so often a hardware engine (or software routine) can read a next entry in the CAM and detect/correct using the ECC stored in the entry. Such approaches are often called "scrubbing" the CAM entry.

A disadvantage to this first conventional technique is that a CAM could generate incorrect results for a long time before the background scan comes around to correcting the CAM entry containing the error. More precisely, for a CAM block with 4K (4096) entries, if entry numbered X gets an error immediately after the scan has crossed it, it will be another 4K scrub operations before the background scan engine comes around to checking and correcting entry X. If the "scrub" is performed once every 1000 cycles (being executed in the background), this could result in 4 million wrong search results before the error is addressed. Such a relatively high rate of possible error can be unacceptable for several CAM applications. One such application can be CAMs used to search access control lists (ACLs) that for filtering incoming packets for network security.

One approach to improving the performance of the first conventional approach can be to increase the scrub rate. However, doing so reduces the performance of the CAM device, and may still present high potential for errors. For example, if 1 scrub was executed in a CAM every other operational cycle (at a hefty 50% overhead), 8,000 wrong search results could be generated before the error was corrected.

A second conventional approach will now be described with reference to FIG. 21. FIG. 21 is a block diagram showing a packet processing system 2100 configured for error correction. It is noted that the approach shown is used only for solving the limited problem of detecting of false-hits, and hence is, strictly speaking, not related to the problem at hand of providing on-the-fly error correction. That is, it is not possible to provide error correction with this approach. However, examining the operation of the system is believed to be helpful in understanding concepts of the various embodiments of the invention described below.

The packet processing system 2100 includes a packet processor 2102, a CAM 2104, and an SRAM 2106. In the technique of FIG. 21, each entry of a CAM 2102 can store a data value (e.g., E1, E2). In addition, each entry of SRAM 2106 can store such data value, along with ECC bits for the data value. In a search operation, in response to an applied key value "key" (and assuming a "hit" result), CAM 2102 can return an index value "indx". Subsequently, the SRAM 2106 can be read utilizing the index value to access the corresponding data value and ECC value. The data value and ECC value can verify that the entry stored in SRAM matches the incoming key.

The approach of FIG. 21 is not without disadvantages. In particular, as noted above, the approach is only capable of providing detection for false-hit cases. That is, false misses are not addressed.

For example, suppose a soft-error causes a "false hit" on CAM entry 2106-1 storing value E1 (i.e., a soft-error causes an entry that would otherwise miss to cause a hit). SRAM entry 2108-1 will indicate that that data value E1 does not match the key and the packet processor 2102 can properly detect the error. However, the packet processor 2102 cannot immediately correct the error. The error can be corrected by some later write operation to entry 2108-1 (to overwrite erroneous data). A search with the same key would then have to be repeated.

However, this technique does not work if there is more than one error in some entry in of the CAM. That is, if another entry causes a false hit, the same process would be repeated. This can result in delays and non-deterministic search times.

Still further, suppose that CAM entry 2106-2 generates a "false miss", i.e., data value E2 should have matched the key but there was a soft-error which caused the CAM entry 2106-2 to be a miss. In such a case, a CAM 2104 would return a "miss" indication, and there is no way to know whether such a miss is valid, or the result of an error in some entry (which would have otherwise hit the incoming key).

Thus, the above approach cannot detect (let alone correct) "false miss" cases.

A third conventional approach is shown in FIG. 22.

FIG. 22 shows a system 2200 that employs error-correction based on majority voting. In the example shown, a same database can be stored in three different CAMs (2202-0, 2202-1 and 2202-2). A packet processor (not shown) issuing searches to the CAMs (2202-0, 2202-1 and 2202-2) can evaluate a search result by taking a majority result. Such an approach may be sufficient for a single-bit error (occurring over any of the three CAMs). However, the approach may not be sufficient in the event of more than a single-bit error, because a one-bit error occurring anywhere (not just in the same entry location) in a majority of the CAMs (in this case two CAMs) can defeat the scheme. This is described in more detail in the following example.

Referring still to FIG. 22, the three CAMs (2202-0, 2202-1 and 2202-2) would ideally contain the same database. Assume that three entries in each CAM (2204-01-03, 2204-11-13, and 2204-21-23) are supposed to store data values E1, E2 and E3, respectively. Further, assume that an applied key is supposed to match value E3. In such an arrangement, the correct behavior of the above entries of each CAM (2202-0, 2202-1 and 2202-2) would be to generate a miss, miss, and hit respectively.

However, if there is a "false hit" error in entry 2204-01 of CAM 2202-0 and a "false hit" error in entry 2204-12 of CAM 2202-1, a search would lead to three different results, and hence could confuse the majority voting logic. Thus, this arrangement illustrates how two one-bit errors anywhere in the CAMs can defeat the scheme.

A variation of the above third conventional approach can be to repeat a database within one CAM device. That is, a database can be replicated inside multiple blocks within a CAM. Logic can compare the search results from such different blocks according to majority voting. This approach again suffers from the limitation that two one bit errors anywhere in the CAM blocks can defeat the scheme, and is hence not as powerful as protecting each entry against one bit errors. Such an arrangement is shown in U.S. Pat. No. 7,254,748, titled "ERROR CORRECTING CONTENT ADDRESSABLE MEMORY" and issued to Wright et al. on Aug. 7, 2007.

In light of the above, it would be desirable to arrive at some of providing error correction in a CAM device and/or system that does not suffer from the above drawbacks of the conventional approaches.

SUMMARY OF THE INVENTION

The present invention can provide an error correction method and device for a content addressable memory (CAM) in which error correction occurs "on the fly". That is, an error corrected value can be generated in essentially the same amount of time as a search matching a data value without an error. Devices and methods for writing and reading data values according to such error correction schemes are also included.

According to one embodiment, present invention can include a CAM that provides error correction for stored data values. The CAM can include a plurality of CAM entries that store error correcting data values, each CAM entry generating a match result indication when a data value stored therein is compared to an applied search key value. Each CAM entry includes a first multi-bit portion that stores an entry data value, and a second multi-bit portion, different from the first multi-bit portion that stores at least a portion of the data value of the same entry.

Such an arrangement can provide "column expansion" of a data value. In such an arrangement a search operation can be performed against both an entry data value and at least a portion of the entry data value. Thus, an error that might generate a "false miss" on the entry data value can generate an error corrected "hit" with the at least portion of the data value.

According to one aspect of the embodiments, each second multi-bit portion stores all of the entry data value. Such an arrangement can be applicable to an error correction scheme that employs only column expansion. A "false miss" in a first portion of an entry can be error corrected by searching on the second portion of the entry.

According to another aspect of the embodiments, each second multi-bit portion stores only a portion of the entry value. When utilized with other features of error correction of the invention, such as "row expansion", such an arrangement can improve error correction by increasing the probability that a false miss will be detected by an entry, without fully replicating the entry in the column direction of CAM array. In one very a particular arrangement, an entry value can have more significant bits and less significant bits, and each second multi-bit portion stores only the most significant bits of the entry data value.

According to another aspect of the embodiments, the plurality of CAM entries are logically arranged into CAM entry pairs, and the first multi-bit portion of both CAM entries of each entry pair stores the corresponding entry data value. In addition, the second multi-bit portion of each entry pair stores the at least a portion of the corresponding entry data value.

Such an arrangement can provide both "column expansion" and "row expansion" of a data value. In such an arrangement, both a "false hit" type error and "false miss" type error can be corrected.

According to another aspect of the embodiments, each CAM entry has a corresponding address, and the addresses of each CAM entry pair are adjacent to one another.

The present invention can also include a method of error correction for a CAM. The method can include, in a search operation, replicating at least a portion of a search key value to generate a replicated search key value, combining the search key value with the replicated search key value to produce an applied search key value, and applying the applied search key value to the CAM as a comparand value.

Such an arrangement can allow a CAM to be searched with error correction with conventional CAM instructions and/or a conventional CAM structure.

According to one aspect of the embodiments, replicating at least a portion of the search key includes replicating the entire search key to generate the replicated search key.

According to another aspect of the embodiments, the step of applying the applied search key value can include applying the applied search key value with a first global mask that masks a replicated search key portion of the applied search key value from a compare operation in the CAM array, and applying the applied search key value with a second global mask that masks the search key portion of the applied search key value from a compare operation in the CAM.

Such an arrangement can be employed for schemes only utilizing "column expansion". When used in such a limited fashion, savings can be achieved with respect to storage space. However, such an approach alone may only provide for error detection, and not error correction.

According to another aspect of the embodiments, the step of applying the applied search key value to the CAM array can include applying the applied search key value in combination with a set select value that corresponds to at least one data set of a plurality of different data sets stored in the CAM. In such an arrangement, error correction can be applied to selected entries, and hence selected data sets.

According to another aspect of the embodiments, the method can further include receiving a search result from the CAM in response to the application of the applied search key value, the search result including an index value if the search result indicates a match with a CAM entry; and accessing a memory that includes storage locations corresponding to entries within the CAM according to at least a portion of the index value.

According to another aspect of the embodiments, an index value can be a multi-bit value having a least significant bit (LSB). Further, accessing the memory includes accessing the memory without the LSB of the index value. Such an arrangement can provide a more compact associated memory structure for a CAM device employing row expansion.

According to another aspect of the embodiments, a memory may comprise an associated data memory that stores an associated data value corresponding to each entry of the CAM. In another arrangement, a memory can comprise an error correction memory that stores error correction data values corresponding to each entry of the CAM. Thus, a search operation can yield associated data corresponding to a search key and/or error correction corresponding the entry matching a search key.

According to another aspect of the embodiments, a method can also include, in a write operation, replicating at least a portion of a write data value to generate a replicated write data value, combining the write data value with the replicated write data value to produce an applied write data value, and writing the applied write data value to a CAM address. In this way, a write operation replicates entry data to provide error correction in a CAM device.

According to another aspect of the embodiments, a method can further include incrementing the CAM address, and writing the applied search key value to the incremented CAM address. In this way, row data can be replicated, for the writing of data according to "row expansion".

According to another aspect of the embodiments, a method can also include, in a read operation, reading from a CAM address to retrieve CAM read data value having a data value portion and a replicated data value portion, the replicated data value portion being formed from at least a portion of a data value stored in the data value portion. The method can also include removing the replicated data value portion to produce an entry value. In this way, a read operation can provide an entry value "stripped" of any replicated portion.

The present invention can also include an error correction program embodied on machine readable media for providing error corrected search results from a content addressable memory (CAM). Such a program can include a replicating sequence for receiving a search key value and replicating at least a portion of the search key value to produce a replicated search key value, a combining sequence for combining the search key value with the replicated search key value to produce an applied search key value, and an application sequence for applying the applied search key value to the CAM as a comparand value.

In this way, error correction can be made available with programmable steps executed by a processor, or the like.

According to another aspect of the embodiments, an application sequence can further include a mask selection sequence for selecting a first mask value that masks the replicated search key value portion of the applied search key value, and selecting a second mask value that masks the search key value portion of the applied search key value. Such an arrangement can provide for error correction in arrangements that only include column expansion.

The present invention can also include a CAM with error correction. The CAM can include a CAM array having a plurality of entries, each entry including a first portion and a second portion, and a data replicator coupled to receive a input data value and output a replicated input data value that includes at least a portion of the input data value. The CAM can further include a data driver having inputs coupled to the data replicator that outputs the data value and replicated key value as an applied data value to the CAM array.

In this way, a search key value and/or write data value can be replicated by a CAM before being provided to a CAM array, thus providing error correction capabilities with circuits of the CAM.

According to another aspect of the embodiments, a data replicator can replicate the entire input data value.

According to another aspect of the embodiments, the data replicator can replicate a portion of the input data value.

According to another aspect of the embodiments, a CAM can also include a global mask register having a plurality of storage locations for global mask values. Each global mask value can mask predetermined bits of the applied data value from a compare operation of the CAM array. In such an arrangement, a CAM device can provide error correction for an arrangement utilizing only column expansion.

According to another aspect of the embodiments, a CAM can also include a data driver that comprises a compare data driver coupled to compare data lines of the CAM array, and the applied data value is an applied search key value. In addition or alternatively, a data driver comprises a write data driver coupled to bit lines of the CAM array, and the applied data value is an applied write data value.

According to another aspect of the embodiments, a CAM can also include a memory interface circuit coupled to receive an index value from the CAM array in response to the application of a search key value as the applied data value. The memory interface circuit including an address application section that outputs at least a portion of the index value.

According to another aspect of the embodiments, a CAM can also include at least one addressable memory circuit comprising an associated data random access memory (RAM) having an address decoder coupled to receive the at least a portion of the index value, the associated data RAM having RAM locations for storing associated data values corresponding to each CAM entry.

According to another aspect of the embodiments, a CAM can also include at least one addressable memory circuit comprising an error correction data random access memory (RAM) having an address decoder coupled to receive the at least a portion of the index value, the error correction RAM having RAM locations for storing error correction data values corresponding to each CAM entry.

BRIEF DESCRIPTION OF THE DRAWINGS

FIGS. 7A and 7B are flow diagrams showing detailed of examples of steps shown in the fourth embodiment.

FIG. 8A is a flow diagram showing detailed of examples of sub-steps that can be included in the fourth embodiment. FIG. 8B are flow diagrams showing detailed examples of sub-steps shown in FIG. 8A.

FIG. 9A is a flow diagram showing detailed of examples of sub-steps that can be included in the fourth embodiment.

DETAILED DESCRIPTION

Various embodiments of the present invention will now be described in detail with reference to a number of drawings. The embodiments include a content addressable memory (CAM) method of error correction for a (CAM). The various embodiments can provide on-the-fly error correction scheme for a CAM without the various drawbacks noted above. The various embodiments may be particularly applicable in ternary CAMs, in which each bit can be a "wildcard" value (i.e., a bit can be masked and thus excluded from a compare operation). Further, other embodiments described below can provide trade-offs between the amount of CAM space utilized and the functionality provided. For example, embodiments are described that can provide correction for false-hits, but not for false-misses and/or provide correction for false-misses, but not for false-hits.

Figure 1A:
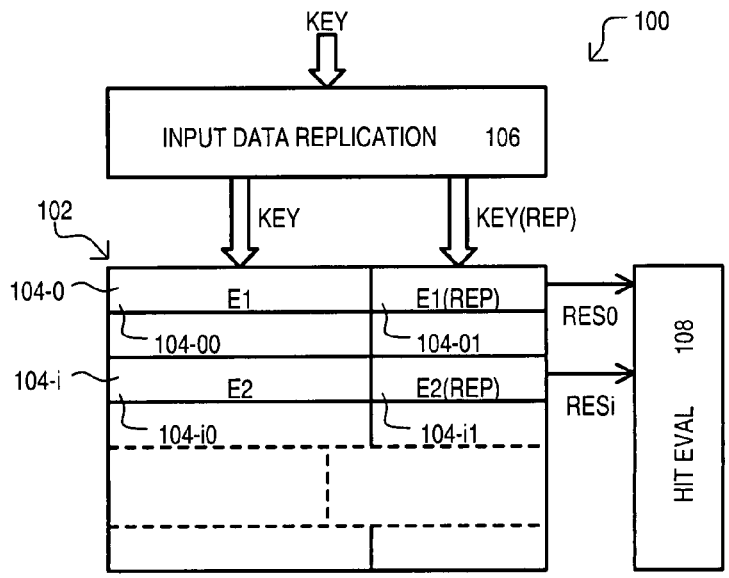
FIGS. 1A and 1B are block diagrams of a first embodiment of the present invention.

Referring now to FIG. 1A, a first embodiment of the present invention is set forth in a block diagram and designated by the general reference character 100. A first embodiment 100 can include a CAM array 102 that includes a number of CAM entries, two of which are shown as 104-0 and 104-i. In addition, a first embodiment can include an input data replicator 106 and a hit evaluator 108.

Within CAM array 102, each entry (e.g., 104-0 104-1) can include two or more portions. One portion can store a data value for evaluation with an applied key value, another portion of the same entry can store all or a portion of the same data value. Thus, unlike a conventional data table arrangement, that would store a single data value per entry, a first embodiment 100 can store both a data value and a replicated data value. In the very particular example of FIG. 1A, entry 104-0 includes a first portion 104-00 that stores a data value E1 and a second portion 104-01 that stores a replicated version of the data value E1(REP). Similarly, entry 104-$i$ includes a first portion 104-0$i$ that stores a data value E2 and a second portion 104-0$i$ that stores a replicated version of the data value E2(REP).

The general approach shown in FIG. 1A can be considered "column expansion" of a data set (e.g., database), as data values are replicated (in full or in part) in the column direction with respect to the CAM array 102.

Figure 1B:
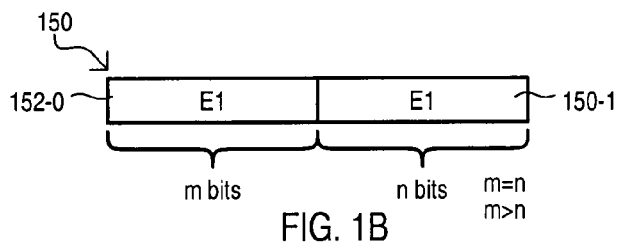

FIG. 1B illustrates a data value arrangement of one entry 150 in a CAM array. As shown, one portion 152-0 of the entry 150 can store a data value E1 composed of "m" bits, while another portion 152-1 of the entry 150 can store a replicated data value E1(REP) composed of "n" bits. Preferably, a replicated data value E1(REP) is an exact replica of data value E1. That is, E1=E1(REP) and m=n. However, if a smaller consumption of storage values is desired, at the expense of reducing the error detection capabilities of the system, a replicated data value E1 (REP) may represent only a portion of data value E1, and m>n. As but one example, more significant bits of data value E1 can be replicated. Of course, other partial replication arrangements can be employed.

Referring back to FIG. 1A, in an error corrected search operation, an input data replicator 106 can generate an applied search key value KEY_APP that includes a key value KEY, as well as a replicated key value KEY(REP). It is understood that a replicated key portion KEY(REP) can be generated from the key value KEY in the same general way as the replicated data value (e.g., E1(REP)) is generated from the corresponding data value (e.g., E1).

As will be described in more detail below, an input data replicator 106 may be implemented by a process external to a CAM device, by circuitry inherent in the CAM device, or some combination thereof.

A hit evaluator 108 can receive match results (e.g., hit or miss) generated from the CAM entries, and according to such results generate a final search result value. A final result value can include an index value or associated data, as but two examples.

As in the case of input data replicator, a hit evaluator 108 may be implemented by a process external to a CAM device, by circuitry inherent in the CAM device, or some combination thereof.

Figure 2:
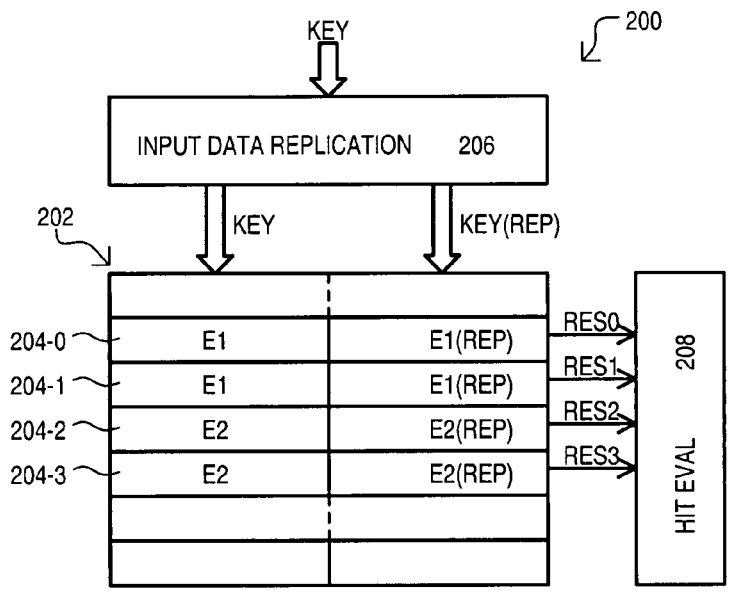
FIG. 2 is a block diagram showing a second embodiment of the present invention.

While the column expansion approach of FIG. 1A can provide for error correction capabilities in CAM search operations, a greater degree of error correction can be provided by implementing both column expansion and "row expansion", as shown in FIG. 2.

FIG. 2 shows a block diagram of a second embodiment of the present invention designated by the general reference character 200. A second embodiment 200 can include the same general sections as the first embodiment. Thus, like sections are referred to by the same reference character but with the first digit being a "2" instead of a "1".

However, unlike the first embodiment, data values and replicated data values are repeated in the row direction. Thus, a CAM array 202 includes entry pairs, each of which stores a data value and replicated data value. Preferably, such entry pairs are logically adjacent to one another with respect to any prioritizing circuits associated with the CAM array 202. As but one example, one entry of a pair may have an address adjacent to the other entry of the pair. In the very particular example of FIG. 2, entries 204-0 and 204-1 are error correcting entry pairs, each storing both a data value E1 and a replicated data value E1 (REP). Similarly, entries 204-2 and 204-3 are error correcting entry pairs, each storing both a data value E2 and a replicated data value E2(REP).

The general approach shown in FIG. 2 can be considered to show column expansion and row expansion of a data set, as data values are replicated (in full or in part) in the column direction and replicated in full in the row direction with respect to the CAM array 202.

An input data replicator 206 can replicate incoming key values in the same general fashion as that of the first embodiment.

A hit evaluator 208 can evaluate hits based on entry pairs. In particular, a "hit" result from both entries of an error correcting entry pair can be considered a valid hit. For example, in the arrangement of FIG. 2, when both match results RES0 or RES1 indicate a "hit", hit evaluator 208 can output a result indicating that a key value KEY has matched a data value E1. Of course, such results may incorporate masking of data values according to any of numerous well-known techniques. In the same fashion, if both match results RES2 or RES3 indicate a "hit", hit evaluator 208 can output a result indicating that a key value KEY has matched a data value E2.

It is noted that while the above description has described a key value KEY as "matching" a data value, it is understood that in a ternary CAM device, a key value may not be identical to an data value but still match such data value due to wildcard bits.

It is also understood that the above hit evaluation can be done "natively" in modern CAMs, which can treat two consecutive 72-bit words as a single 144-bit entry.

Having described CAM entries and related data structures, the error correcting features of such arrangements will now be described in more detail with particular examples.

Figure 3A:
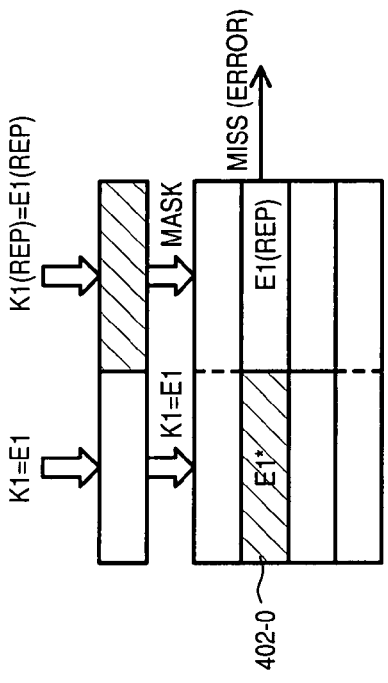
FIGS. 3A and 3B are block diagrams showing the operation of a content addressable memory (CAM) that employs both column expansion and row expansion according to embodiments of the present invention.
Figure 3B:
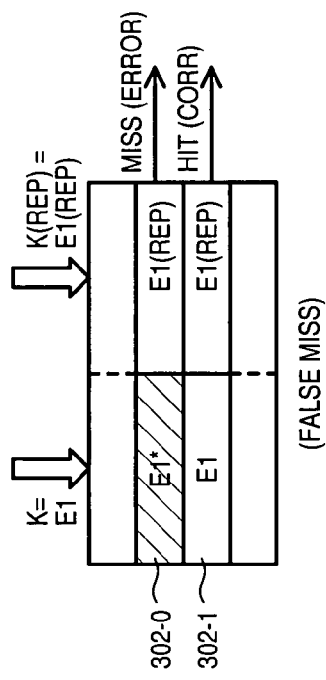

FIGS. 3A and 3B illustrate how a CAM employing both column and row expansion can generate error corrected results for both "false miss" errors and "false hit" errors. It is noted that such results are generated "on-the-fly". Both examples show an error correction entry pair 302-0 and 302-1 that each should store a data value E1 and replicated data value E1(REP).

In the case of FIG. 3A it is assumed that the data value of entry 302-0 contains an error that generates a "false miss". This erroneous data value is represented by an asterisk E1*. In such a case, the erroneous data value E1* will generate an erroneous "miss" hit result for the entry 302-0. However, because entry 302-1 includes a correct data value E1, entry 302-1 will generate a correct "hit" result. In this way, false miss errors can be corrected with row and column expansion of data values.

In the case of FIG. 3B it is assumed that the data value of entry 302-0 contains an error that generates a "false hit". This erroneous data value is also represented by an asterisk E1*. In such a case, the erroneous data value E1* will erroneously match the key value KEY of the applied key value. However, because entry 302-0 includes replicated data value E1(REP), such a replicated data value E1(REP) can force a miss for the entry based on comparison with the replicated key value KEY(REP) of the applied key value. In this way, false hit errors can also be corrected with row and column expansion of data values.

Again, all such corrections are "on-the-fly" generated search results in essentially the same amount of time as normal search operations (search operations involving no such errors).

While a row and column expansion approach can provide a high degree of error correction, as noted above, it may be desirable to employ only column expansion or only row expansion in the event conservation of CAM space, or other concerns dictate a smaller database size.

As but a first example, column expansion can be used alone, resulting in the utilization of only one half of the CAM space as compared to both column and row expansion. In such a case, a key value and replicated key value can be applied as described above. However, such an approach can only provide error correction for false hit cases, and not address false misses. Conversely, row expansion can be used alone, again utilizing only one half of CAM space as compared to both column and row expansion. However, such approach can only provide error correction for false miss cases, and not address false hits.

Figure 4A:
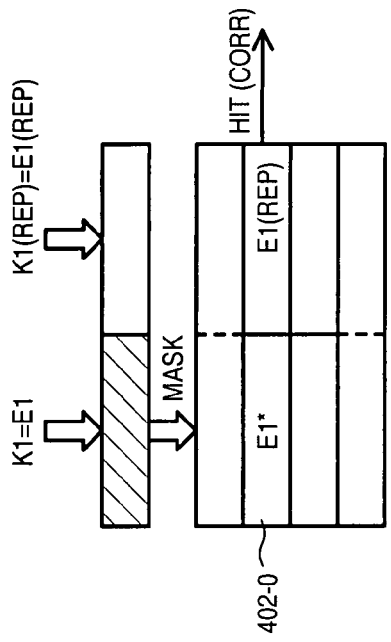
FIGS. 4A and 4B are block diagrams showing the operation of a CAM that employs only column expansion according to embodiments of the present invention.
Figure 4B:
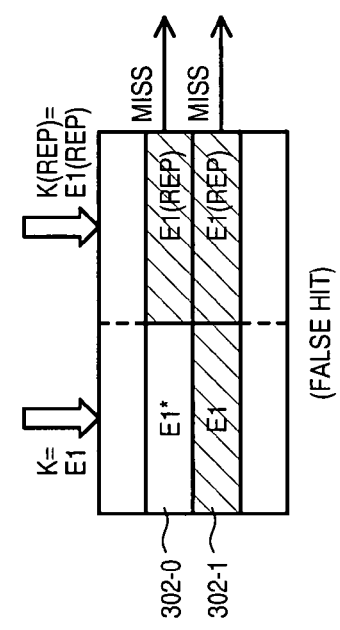

Yet another arrangement is shown in FIGS. 4A and 4B. FIGS. 4A and 4B illustrate how a CAM employing column and not row expansion can provide error detection, but not error correction. The figures show an error correction entry 402-0 that each should store a data value E1 and a fully replicated data value E1(REP). In the arrangement shown, an input data replicator 406 can provide global masking. Such global masking can mask a replicated data value portion of entries in a first search according to key value KEY, and can then mask data value portions of entries in a second search according to the same key value KEY.

In the case of FIG. 4A it is assumed that the data value of entry 402-0 contains an error that generates a "false miss". An applied key value applies key K1 to data value portions, but masks replicated data value portions. Thus, erroneous data value E1* forces an erroneous "miss" result for the entry.

However, as shown in FIG. 4B, in a subsequent search according to the same key value K1, data value portion can be masked, while a fully replicated key value K1(REP) is applied to replicated data value portions. Thus, erroneous data value E1* is masked, and fully replicated data value E1(REP) can generate a hit result. Such conflicting results can indicate an error has occurred in the entry. A false hit type error may also be detected in the same fashion.

It is understood that the column expansion only approach of FIGS. 4A and 4B can increase search times by executing two searches for each key value. In addition, such an approach will not provide any error correction and will only work provided there is only one error in the entire CAM. However, the employed database size is smaller than approaches having both column and row expansion, as entries are not replicated in the row direction. Still further, when employing column expansion only, "full" replication is utilized. That, is a replicated key value matches the key value, bit-per-bit. Similarly, all replicated data entry values match their corresponding entry values, bit-per-bit.

Figure 5:
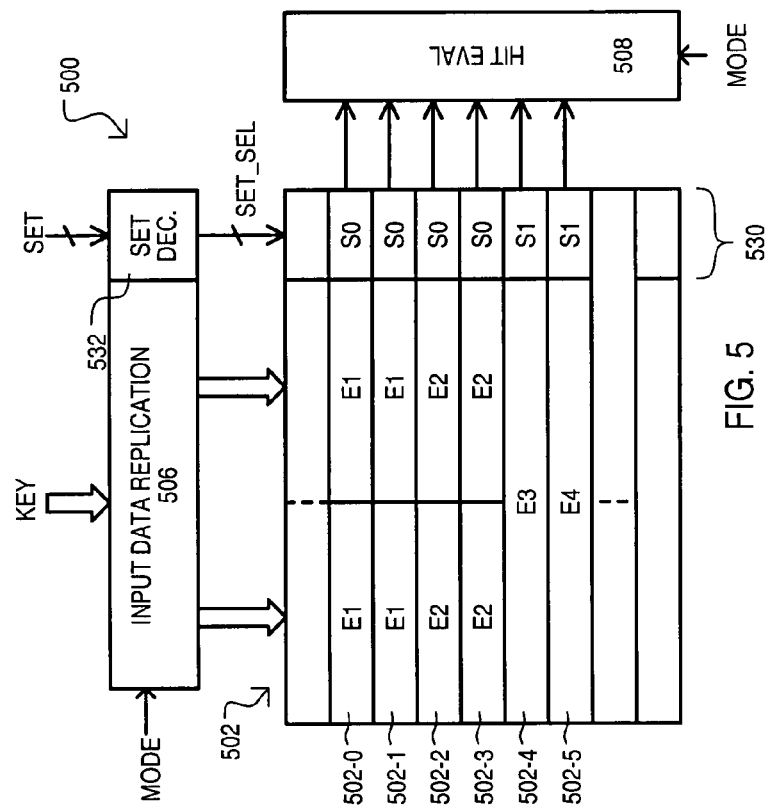
FIG. 5 is a block diagram showing a third embodiment of the present invention.

Referring now to FIG. 5, a third embodiment is shown a block diagram and designated by the general reference character 500. A third embodiment 500 can include the same general sections as the second embodiment. Thus, like sections are referred to by the same reference character but with the first digit being a "5" instead of a "2".

FIG. 5 shows an arrangement in which error correction can be selectively applied to one data set of multiple data sets existing in a CAM array. That is, data values may be replicated in only selected entries (employ error correction according to the embodiments), while other value include non-replicated data (do not employ error correction). In a search operation with error correction, an applied key can include a replicated key value, and those entries employing with error correction can be included in the search. In a search operation without error correction, an applied key may not include a replicated key value, and those entries employing with error correction can be excluded from the search.

The very particular example of FIG. 5 includes set designators (530) for each entry of a CAM array 502. Thus, entries 502-0 to 502-3 include error correction entries that include row and column expansion, and represent an error correction data set S0. In contrast, entries 502-4 and 502-5 do not include error correction, and store non-replicated data values E3 and E4, and belong to data set S1.

In the arrangement of FIG. 5, input data replicator 506 is selectively enabled, for example by a MODE determiner. Thus, in an error correction mode, input data replicator 506 can provide an applied key value that includes a received key value and a replicated version of such a key value. However, in a non-error correction mode, input data replicator 506 can be disabled, allowing a non-replicated key to be applied to CAM array 502.

According to a third embodiment, a hit evaluator 508 can operate according to a MODE determine as well. More particularly, in an error correction mode a hit can be considered valid based on the particular error correction criteria involved. In a non-error correction mode, a hit is based on the output of an entry. Even more particularly, if row and column expansion is employed, a hit can be considered valid when either of two entries of an error correcting pair generates a hit indication. If only column expansion is employed, a hit can be considered valid when either of two search results (applying the same key value) generates hit indication for the same entry. For the non-error correction mode, a hit from any entry is considered valid.

In the very particular example of FIG. 5, a set value decoder 532 is included to generate a set selection value SET_SEL to distinguish one data set from another in a search operation. However, distinguishing between sets in a search operation can be performed according to various other conventional techniques understood by those skilled in the art.

The present invention can also include a method for accessing a CAM having error correction. Such accesses can include, but are not limited to searching a CAM, writing error correcting data to a CAM, and reading error correcting data from a CAM.

Figure 6:
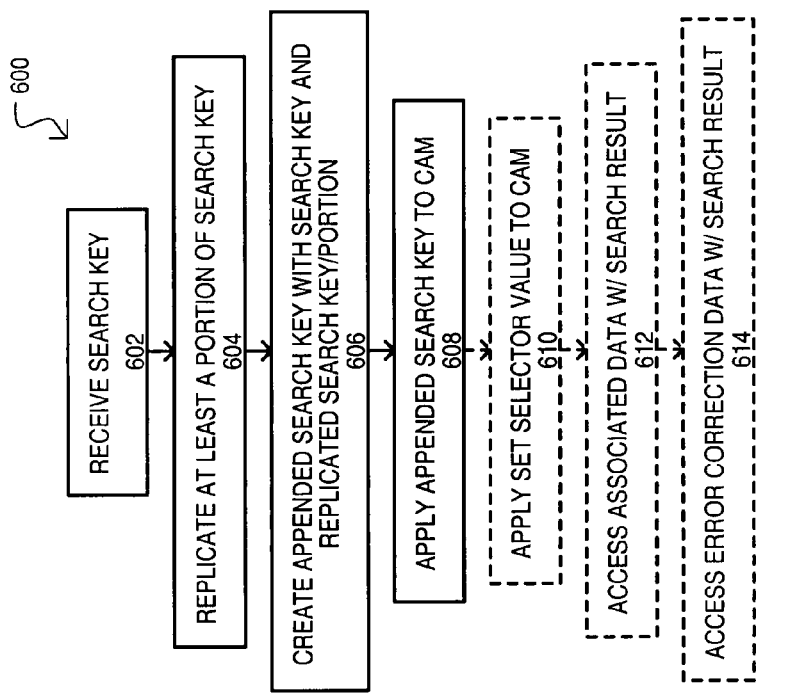
FIG. 6 is a flow diagram showing a method according to a fourth embodiment of the present invention.

One embodiment of such a method is shown in FIG. 6 and designated by the general reference character 600. A method can include receiving a search key (step 602) and replicating at least a portion of the search key (step 604). A method 600 can then create an appended search key 606 with the search key and replicated search key (or replicated search key portion) (step 606). Such an appended search key can be applied to a CAM (step 608).

It is noted that the above steps can be executed in conjunction with a conventional CAM device, provided entries in such CAM device are of sufficient size to accommodate the appended search key. Thus, error correction according to such an arrangement can be implemented with an "off-the-shelf" CAM device. As but one particular example, such error correction can be a series of steps executed by a network processor, or the like, according to instructions stored in a machine-readable media.

Alternatively, all or selected of the steps can be executed by hardware residing on a CAM device.

In this way, a method 600 can provide error correction by executing a series of steps to apply an appended key to a CAM device.

FIG. 6 also shows a number of steps, indicated by dashed lines, which can be included to add features to the method 600. It is understood that a method 600 can include any or none of these steps depending upon which (if any) of the features are desired. Step 610 adds a set selection feature. Step 612 adds an associated data retrieval feature. Step 614 adds an additional error correction/detection feature.

A first such step can be to apply a set selector value to the CAM (step 610). Such a step can include providing a CAM with value that distinguishes between different data sets residing within the entries of the CAM. Such a step can include various well known approaches. As but a few of the many possible examples, such a step can include appending additional bit values to search key according to a data set, providing a "block enable" indication that excludes blocks containing non-error corrected entries, or providing a global mask selection value and additional bit per entry that can exclude non-desired data sets from a search.

Yet another such step can be to access associated data with search results (step 612). Such a step can include utilizing an index value generated by "hit" search result to access data associated with the index value. Even more particularly such a step can include generating an associated data random access memory (RAM) address based on all or a portion of such an index value, and reading associated data from the RAM with the address.

Still another such step can include accessing error correction data with search results (step 614). Such a step can add error correction and/or detection features in addition to those resulting from the above column or row/column expansion approaches. Like step 612, such a step can include utilizing an index value generated by "hit" search result to access ECC data associated with the index value. Even more particularly such a step can include generating an ECC RAM address based on all or a portion of such an index value, and reading ECC data from the RAM with the address.

FIGS. 7A and 7B illustrate two very particular examples of steps 602 to 606 of FIG. 6. FIG. 7A shows how an appended key value (KEY_APP) can be generated by replicating a received key value (KEY_REP=KEY), and concatenating the key value and replicated key value ([K1]:[K1]).

FIG. 7B shows how an appended key value (KEY_APP) can be generated by performing some operation on a received key value to generate a replicated key value (KEY_REP=op{K1}). It is understood that such an operation can include duplicating selected bit locations of a key value. However, alternate embodiments may include more complex functions. An appended key value can then be produced by concatenating the key value and replicated key value ([K1]:[op{K1}]).

FIG. 8A shows a variation of step 608 according to a second embodiment. FIG. 8A shows a step 808 for applying an appended key value to a CAM. Step 808 indicates how such a step may be executed for a CAM employing column expansion only. In such a case, a step 808 can include the sub-step of applying an appended search key with a replicated key portion masked (step 808-0) and applying an appended search key with a key portion masked (step 808-1). While such steps are sequential, they can be in the reverse order.

FIG. 8B illustrates one very particular example of sub-steps 808-0 and 808-1. FIG. 8B shows how masks can be generated to mask alternating portions of an appended search key. The example assumes that a bit value of "1" masks a corresponding bit location in a data value from comparison with a corresponding bit location of the appended search key.

Referring now to FIG. 9A, one particular example of step 612 or step 614 is shown in a flow diagram, and designated by the general reference character 900. Such a step 900 can include the sub-steps of receiving an index value from a CAM (902) and generating a RAM address from the index value. However, unlike conventional arrangements, such a sub-step can exclude one or more bits of the index value (904). Data can then be read with the generated RAM address (906).

Such an arrangement can be particularly applicable to arrangements employing row and column expansion. One very particular example of such an application is shown in FIG. 9B.

Figure 9B:
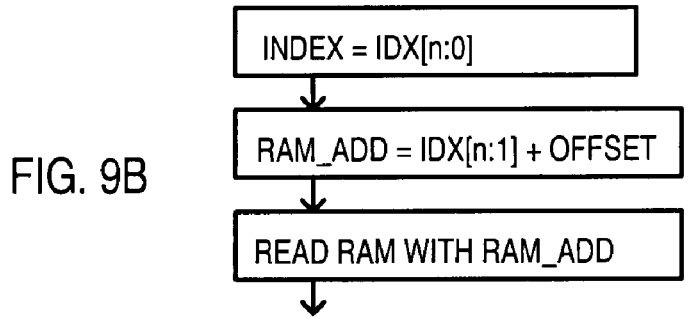
FIG. 9B are flow diagrams showing detailed examples of sub-steps shown in FIG. 9A.

FIG. 9B illustrates how a last bit of an index value IDX[n:0] can be excluded when generating a RAM address. Such an action takes into account the row expansion arrangement that results in a CAM entry pair representing the same data value. Thus, two indices for such a CAM entry pair should index to the same associated data (in the case of step 612) or the same error correction data (in the case of step 614).

Figure 10:
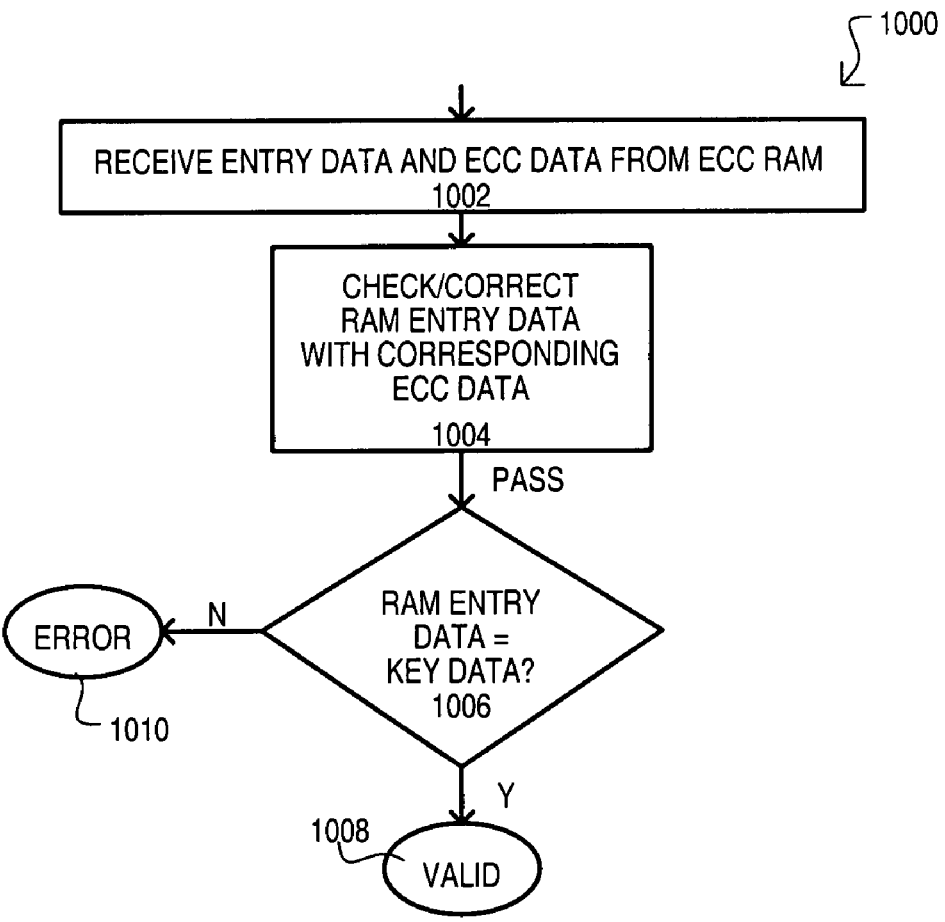
FIG. 10 is a flow diagram showing detailed of examples of sub-steps that can be included in the fourth embodiment.

Referring now to FIG. 10, one particular example of additional sub-steps for step 614 is shown in a flow diagram, and designated by the general reference character 1000. Such a sub-steps can include receiving entry data and error correction data from an ECC RAM (1002). Such a sub-step may occur after accessing an error correction RAM according to the method sub-steps shown in FIGS. 9A and 9B. Entry data can be error checked and corrected with the corresponding ECC data to ensure a correct entry data value (1004). A resulting entry value can then be compared against an applied key value (1006). If the values match (branch Y from 1006), a search can be determined to be valid (1008). If the values do not match (branch N from 1006), a search can be determined to be invalid (1010). Of course, a comparison step 1008 can take into account any masking performed in the original search operation.

While the embodiment of FIG. 6 has demonstrated methods of accessing a CAM that involves searching a CAM, as noted above, the present invention may also include methods of writing data to a CAM, and reading data from a CAM.

Figure 11:
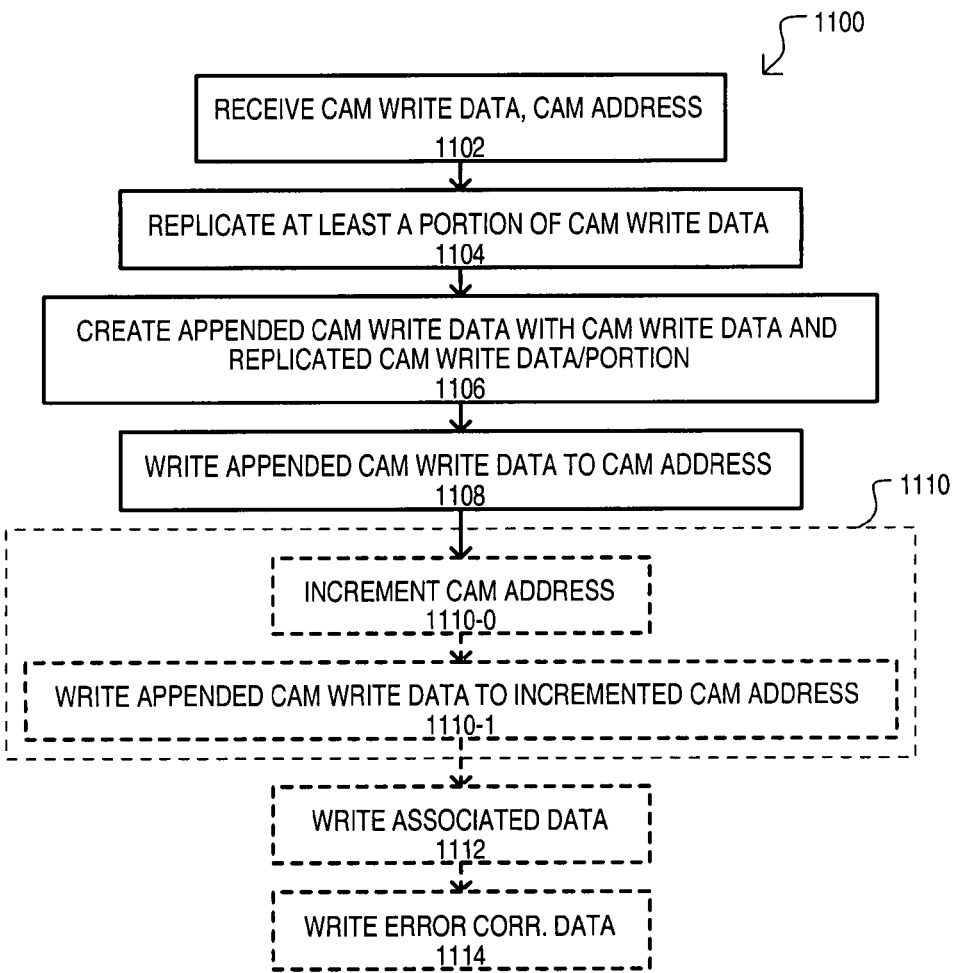
FIG. 11 is a flow diagram showing a method according to a fifth embodiment of the present invention.

Referring now to FIG. 11, a method of accessing a CAM in a write operation is set forth in a flow diagram and designated by the general reference character 1100. A method 1100 can include receiving CAM write data and a CAM address (step 1102). At least a portion of the CAM write data can be replicated (step 1104). An appended CAM write data value can then be created using the write data and replicated write data (step 1106). Such write data replication and creation steps can follow any of the key replication and creation techniques described above (e.g., FIG. 7A or 7B).

Once an appended write data value has been created, such appended write data can be written to the CAM address (step 1108).

Like the previously described search access method above, the write access method of FIG. 11 can be executed in conjunction with a conventional CAM device, provided entries in such CAM device are of sufficient size to accommodate the appended write data value. In addition, these steps can be executed by a network processor, or the like, according to instructions stored in a machine-readable media. Alternatively, all or selected of the steps can be executed by hardware residing on a CAM device.

FIG. 11 also shows a number of steps, indicated by dashed lines, which can be included to add features to the method 1100.

FIG. 11 shows a step 1110 that can be included in the event row expansion is employed. In such a step, a same appended write data value can be written to multiple CAM locations. In the particular example of FIG. 11, such a step can include the sub-step of incrementing the CAM address (1110-0) and writing the appended CAM write data to the incremented CAM address (1110-1).

FIG. 11 also includes a step 1112 that can provide for the writing of associated data feature and a step 1114 that can provide for the writing of error correction data. In particular arrangements, both such steps can include accessing a memory device for a write operation according to the addressing schemes shown in FIGS. 9A and 9B, in the event row expansion is employed. Of course, in the case of step 1112, the write operation writes associated data corresponding to a CAM entry identified by the index value. In the case of step 1114, the write operation writes error correction data corresponding to such a CAM entry.

Figure 12:
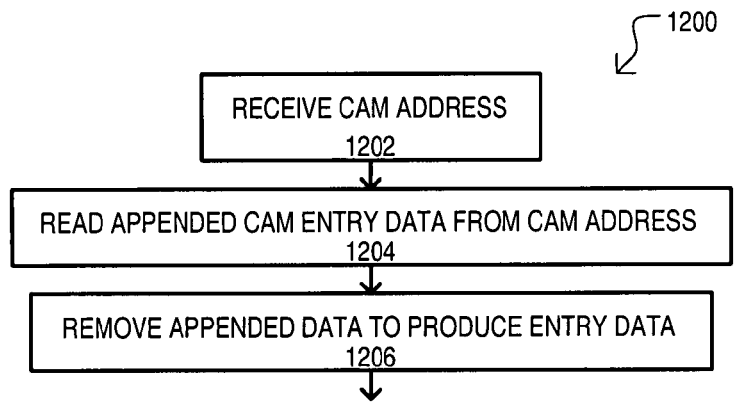
FIG. 12 is a flow diagram showing a method according to a sixth embodiment of the present invention.

Referring now to FIG. 12, a method of accessing a CAM in a read operation is set forth in a flow diagram and designated by the general reference character 1200. A method 1200 can include receiving CAM address (step 1202). Appended CAM entry data can then be read from the CAM (step 1204). It is noted that in the case of a CAM employing row expansion, such a step may ignore a last bit of an address value. It is understood that appended CAM entry data can include one portion storing an entry value, and another portion storing a replicated entry value.

Once an appended CAM entry data value has been read, appended data can be removed to produce entry data (step 1206). This can include removing the replicated portion of such a data value.

Like the previously described search access method described above, the write and read access methods of FIGS. 11 and 12 can be executed in conjunction with a conventional CAM device, provided entries in such CAM device are of sufficient size to accommodate the appended write data value. In addition, these steps can be executed by a network processor, or the like, according to instructions stored in a machine-readable media. Alternatively, all or selected of the steps can be executed by hardware residing on a CAM device.

CAM devices that include hardware for implementing on-the-fly error correction will now be described.

Figure 13:
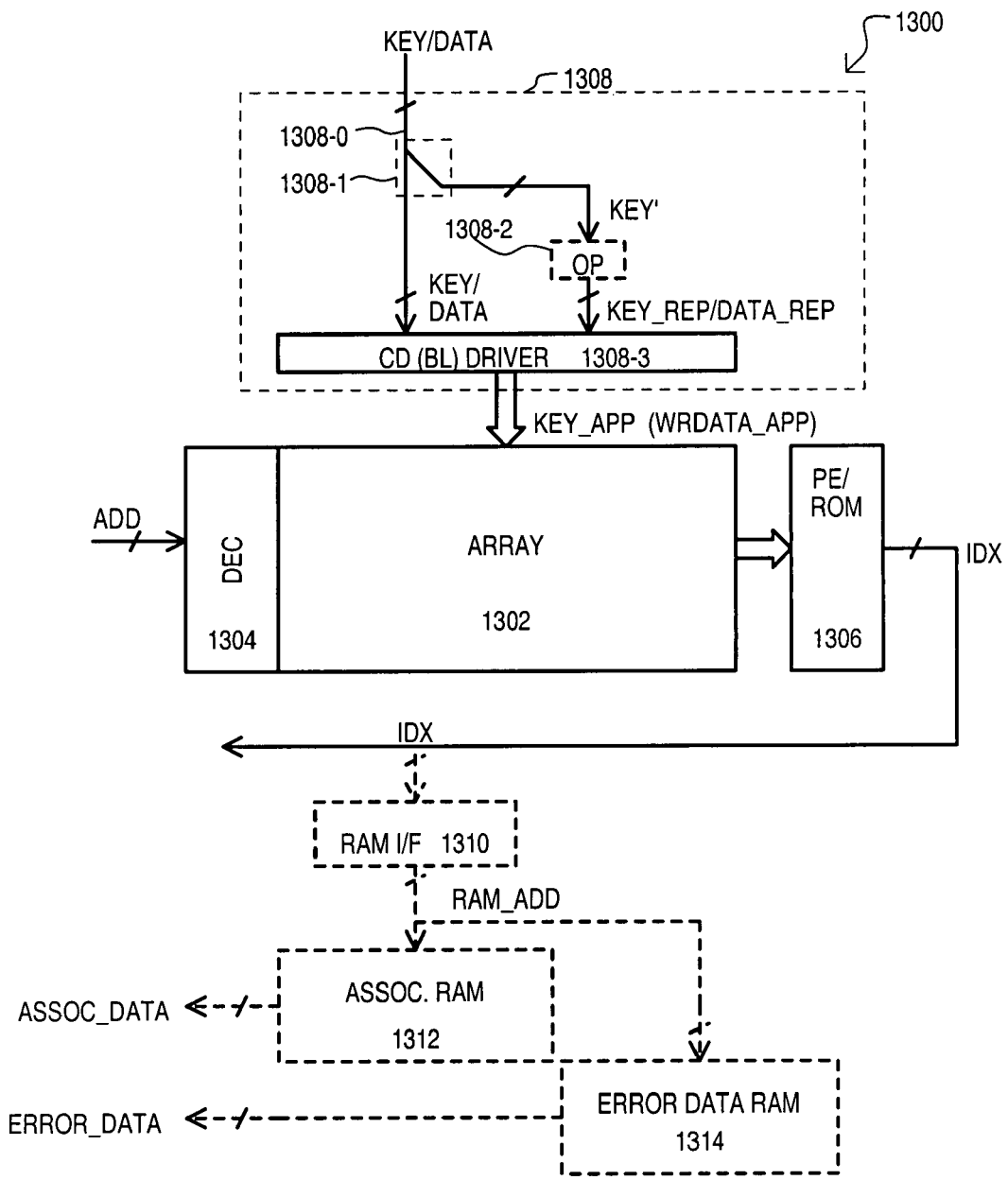
FIG. 13 is a block schematic diagram of a CAM device according to a seventh embodiment of the present invention.

Referring now to FIG. 13, a CAM device according to another embodiment is set forth in block schematic diagram and designated by the general reference character 1300. A CAM device 1300 can include a CAM array 1302, a CAM address decoder 1304, and a priority encoder/read-only-memory (PE/ROM) 1306. Such sections can be conventional in design, well known by those skilled in the art.

Unlike conventional arrangements, a CAM device 1300 may also include an input data replicator 1308. An input data replicator 1308 can include a key input 1308-0 that receives a key value KEY. A key replicator 1308-1 can branch off all, or selected bits of, key value to produce a value KEY'. A replicated key value KEY_REP can be generated from value KEY'. As noted above, a replicated key value can be a copy of all, or a portion of the key value key (i.e., KEY_REP=KEY'). Optionally, an operation circuit 1308-2 can be included if a replicated key value is generated based on some other function (KEY_REP=op{KEY'}). A key value and replicated key value (KEY and KEY_REP) can then be applied to CAM array 1302 as an applied key value KEY_APP by a data driver 1308-3.

If a search operation generates one or more hit indications, a PE/ROM 1306 can prioritize such indications and encode a highest priority hit indication into an index value (IDX).

FIG. 13 also shows optional components, shown by dashed lines, for providing associated data and/or additional error correction. In such arrangements, a CAM device can include memory interface 1310 for generating a memory address (RAM_ADD) in response to an index value IDX. In the case of associated data, such a RAM address can be applied to an associated data RAM 1312 to output associated data (AS-SOC_DATA). In the case of additional error correction, such a RAM address can be applied to an error data RAM 1314 to output error data (ERROR_DATA).

Referring still to FIG. 13, in a write operation, the above input data replicator components can function in the same general fashion, but operate on a write data value DATA instead of key value KEY. Further, a write address will be applied to CAM address decoder 1304. If a CAM device 1300 includes bit lines that differ from compare data lines, the applied write data value WRDATA_APP can be driven on such bit lines.

In this way a CAM device can provide on-the-fly error correction with built-in circuits.

Figure 14:
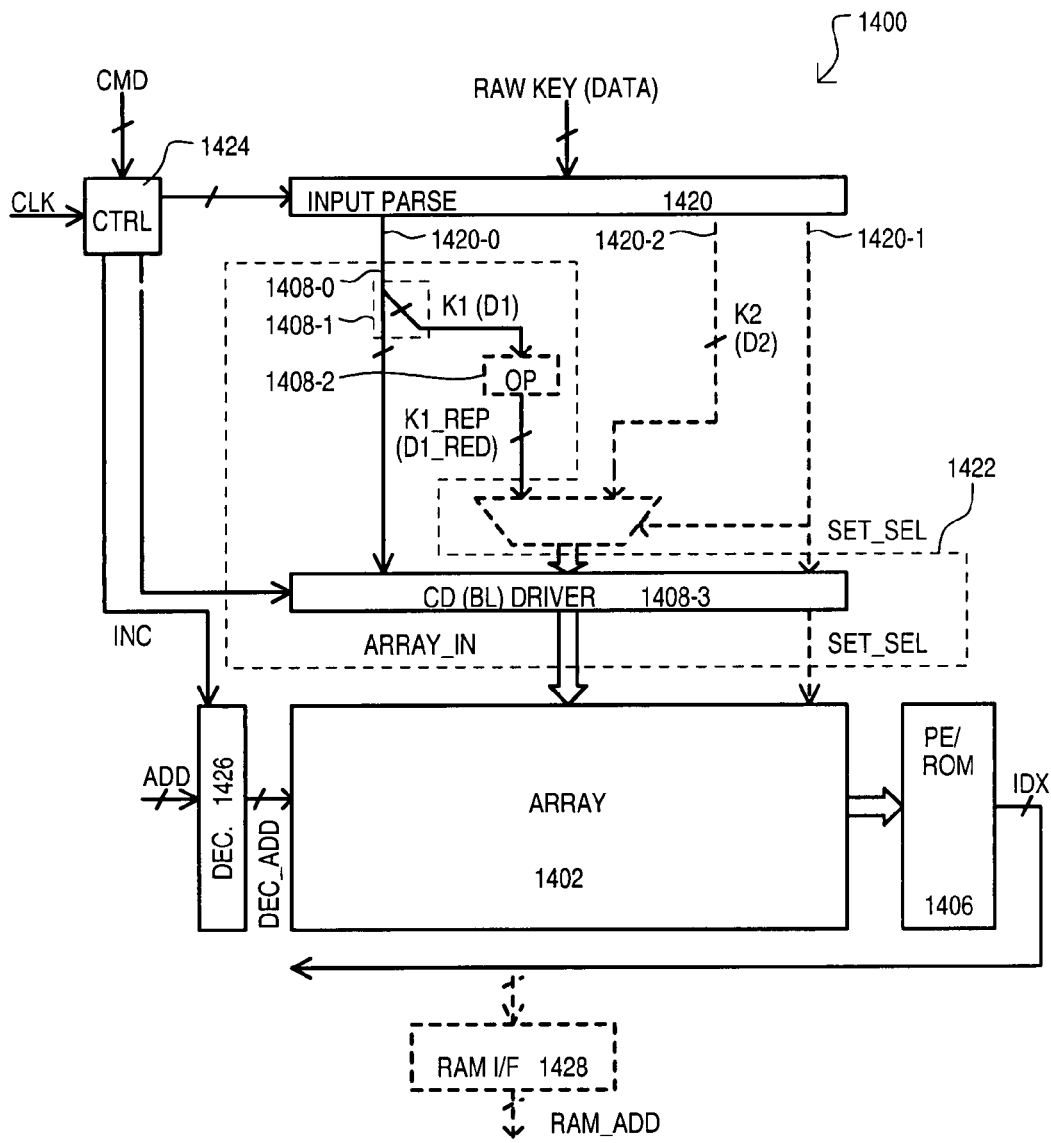
FIG. 14 is a block schematic diagram of a CAM device according to an eighth embodiment of the present invention.

Referring now to FIG. 14, a CAM device according to another embodiment is set forth in block schematic diagram and designated by the general reference character 1400. The arrangement of FIG. 14 can apply on-the-fly error selectively to data sets residing in a CAM array 1402. In addition, a CAM device 1400 can provide a "double" write operation for the case of row expansion.

A CAM device 1400 can include some of the same components as FIG. 13. Accordingly, like components are referred to by the same reference character but with the first two digits being a "14" instead of "13". A CAM device 1400 can also include an input parsing section 1420, a data set selection section 1422, a control circuit 1424, an incrementing address decoder 1426, and memory interface 1428.

An input parsing section 1420 can receive "raw" key data (or write data), and configure such data according to a particular mode or data set being searched. In the very particular example of FIG. 14, input parse section 1420 includes a first parse output 1420-0 and a set select output 1420-1. A first parse output 1420-0 can provide a key value K1 in a search operation or a write data value D1 in a write operation. A set select output 1420-1 can provide a set select value SET_SEL that can distinguish between data sets stored within CAM array 1402.

As shown in FIG. 14, a data selection section 1422 can provide a set selection value SET_SEL to a CAM array 1402.

As will be recalled, when a data set having column expansion is employed, CAM entry widths are larger than a key size in order to provide room to store a replicated version of a key value. It may be desirable to provide a CAM device that can accommodate searches with larger key sizes without error correction.

An arrangement for providing such a capability is shown in FIG. 14 by dashed lines. Thus, as shown in FIG. 14, an input parsing section 1420 can include a third parse output 1420-2. When searching on a large size key value without error correction, a first parse output 1420-0 can provide one portion of search key value, while a third parse output 1420-2 can provide another portion of the same search key value K2. Within a data selection section 1422, a multiplexer (MUX) 1422-1 can output either a replicated key value K1_REP or a second portion of a large key value K2.

A control circuit 1424 can receive a clock signal CLK and a command value CMD. In response to such inputs, a control circuit 1424 can control input parsing section 1420, optional MUX 1422-1, and incrementing address decoder 1426.

Figure 15:
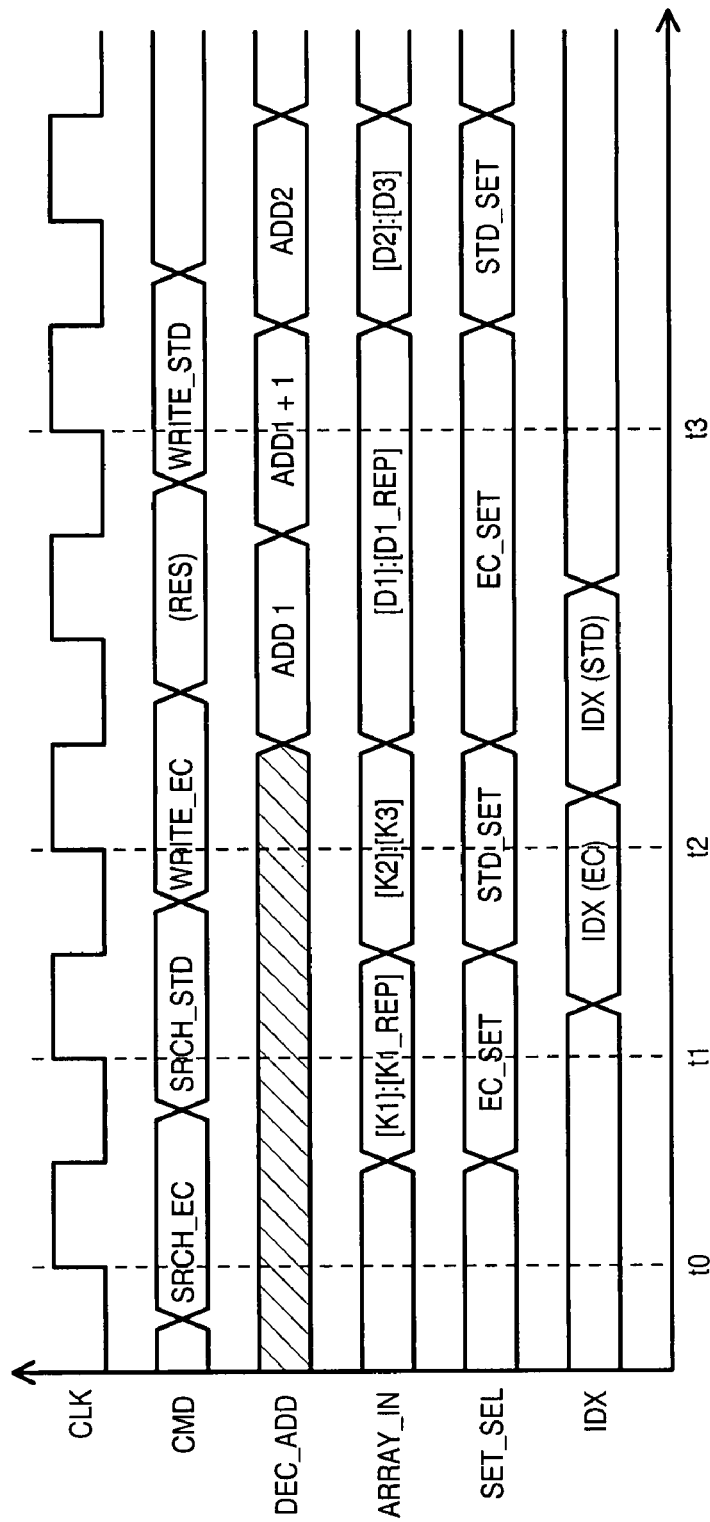
FIG. 15 is a timing diagram showing the operation of the CAM device of FIG. 14.

The operation of the embodiment set forth in FIG. 14 will now be described in conjunction with FIG. 15. FIG. 15 is a timing diagram showing a clock signal CLK, a command value CMD, a decoder address value DEC_ADD, a data value applied to a CAM array ARRAY_IN, a set select value SET_SEL, and an index value IDX.

At time t0, a search operation on an error correction data set can be initiated by issuing an error correction search command (SRCH_EC) and designating a search set with a set select value (EC SET). In response to such a command, an appended search key value [K1]:[K1_REP] can be applied to a CAM array along with the error set selection value EC SET. In the event one or more entries within the specified data set matches the search key value, a CAM device can output an index value IDX (ECC).

At time t1, a search operation on a non-error correction (standard) data set can be initiated by issuing a standard search command (SRCH_STD) and designating a search set with a set select value (STD_SET). In response to such a command, a wide search key value [K2]:[K3] can be applied to a CAM array along with the standard set selection value STD_SET. In the event one or more entries within specified data set matches the search key value, a CAM device can output an index value IDX (STD).

At time t2, a write operation for an error correction data set can be initiated by issuing an error correction write command (WRITE_EC). In some embodiments, a search set can also be designated (EC_SET). In response to such a command, an appended write data value [D1]:[D1_REP] can be written to a CAM array. In addition, if set selection values are embodied as bits in an entry, such bits can also be provided in the write operation.

In the particular error correction write operation shown, it is assumed that row expansion is employed. Thus, a write operation can write a same appended write data value to adjacent CAM entries. Thus, FIG. 15 shows a decoder address being incremented from ADD1 to ADD1+1. It is repeated however, such address generation need not be sequential, and could be simultaneous, with a suitable address decoder. Also, it is understood that if error correction employs column expansion only, a write address would not be incremented.

At time t3, a write operation for a standard data set can be initiated by issuing a standard write command (WRITE_STD). In some embodiments, a search set can also be designated (STD_SET). In the example shown, in response to such a command, a non-appended wide write data value [D2]:[D3] can be written to a CAM array. In addition, if set selection values are embodied as bits in an entry, such bits can also be provided in the write operation.

Referring to FIG. 14, a CAM device 1400 can include various features shown in the embodiment of FIG. 13. For example CAM device 1400 can optionally include a memory interface 1428 that can access an associated data memory and/or error correction memory. In the event, CAM device 1400 employs row expansion, such a memory interface 1428 can exclude a least significant bit of an index value when generating a memory address RAM_ADD.

In this way, a CAM device can selectively apply error correction to one or more designated data sets among multiple data sets within a CAM device.

Figure 16:
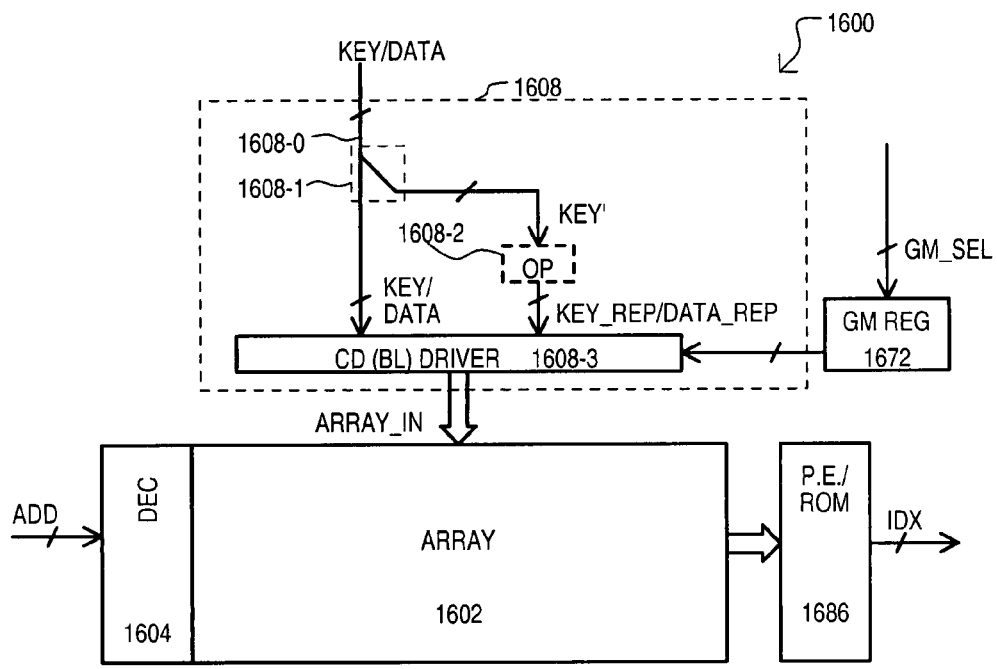
FIG. 16 is a block schematic diagram of a CAM device according to a ninth embodiment of the present invention.

Referring now to FIG. 16, a CAM device according to yet another embodiment is set forth in block schematic diagram and designated by the general reference character 1600. The arrangement of FIG. 16 can apply on-the-fly error to data sets employing column expansion only.

A CAM device 1600 can include some of the same components as FIG. 13. Accordingly, like components are referred to by the same reference character but with the first two digits being a "16" instead of "13".

Unlike the embodiment of FIG. 13, a CAM device 1600 can also include a global mask register 1672 that can provide a global mask value to a data driver 1608-3. According to well-known techniques, a global mask value can mask selected bit locations of all CAM entries from comparison with corresponding bit locations of a search key. A global mask register 1672 can include at least two global masks. A first global mask MASK1 can mask bit locations corresponding a replicated key value portion of an appended search key. A second mask value MASK2 can mask bit locations corresponding a key value portion of an appended search key.

A CAM device 1600 can also include latching PE/ROM 1686. In a search operation, a PE/ROM 1686 can latch a first search result, and then logically OR it with a second search result from the same entry.

Figure 17:
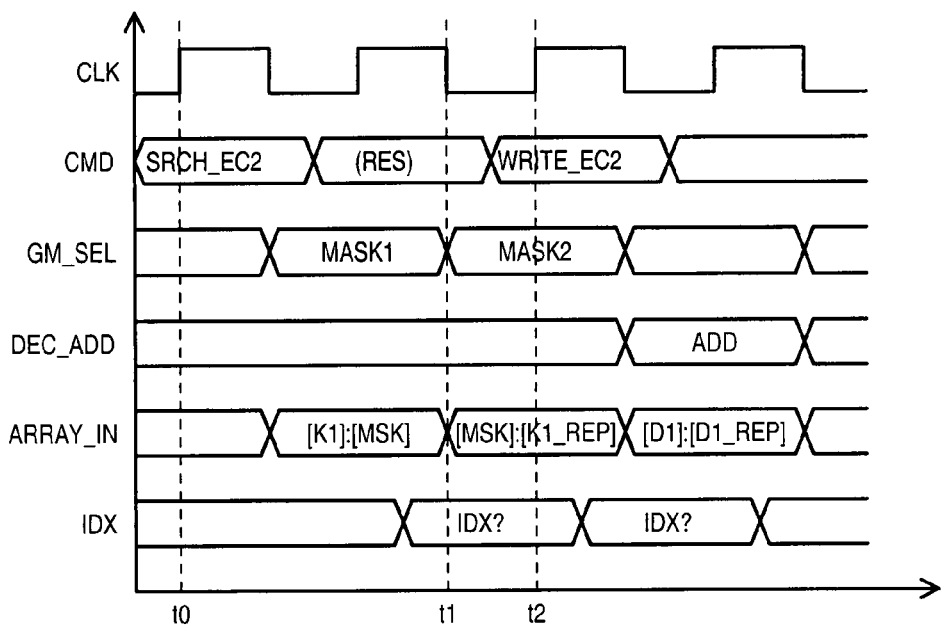
FIG. 17 is a timing diagram showing the operation of the CAM device of FIG. 16.

The operation of the embodiment set forth in FIG. 16 will now be described in conjunction with FIG. 17. FIG. 17 is a timing diagram showing a clock signal CLK, a command value CMD, a global mask select value GM_SEL, a decoder address value DEC_ADD, a data value applied to a CAM array ARRAY_IN, and an index value IDX.

At time t0, a search operation on an error correction data set, having only column expansion, can be initiated by issuing an error correction search command (SRCH_EC2). In response to such a command, an appended search key value [K1]:[K1(REP)] can be presented to data driver 1608-3. However, in response to the same search, a global mask select value GM_SEL can select a global mask MASK1. Thus, a data value applied to CAM array 1602 can have an appended portion masked [K1]:[MSK]. In this way, a key is searched with a data value portion of multiple CAM entries, while replicated portions of such data values are excluded from compare operations. In the event one or more entries within the specified data set matches the search key value, a CAM device can output an index value IDX. The index value IDX is shown with a question mark, as lack of an index value need not indicate a miss. A subsequent search on the replicated portion of the entries could yield a valid hit.

At time t1, the same search operation can continue by presenting the same appended search key value [K1]:[K1_REP] to data driver 1608-3. However, in this portion of the search, a global mask select value GM_SEL can select a second global mask MASK2. Thus, a data value applied to CAM array 1602 can have the key portion masked [MSK]:[K1_REP]. In this way, a key is searched with replicated data value portion of multiple CAM entries, while non-replicated portions of such data values are excluded from compare operations. In the event one or more entries within the specified data set matches the search key value, a CAM device can output an index value IDX. Again, the index value IDX is shown with a question mark, as lack of an index value need not indicate a miss, as the previous search could have yielded a valid hit.

At time t2, a write operation for error correction data employing only column expansion can be initiated by issuing a write command. In response to such a command, an appended write data value [D1]:[D1_REP] can be written to address ADD.

In this way, a CAM device can provide error correction with a column expansion only type data set.

Having described CAM device features for executing search and write operations, one example of CAM read features will now be described.

Figure 18:
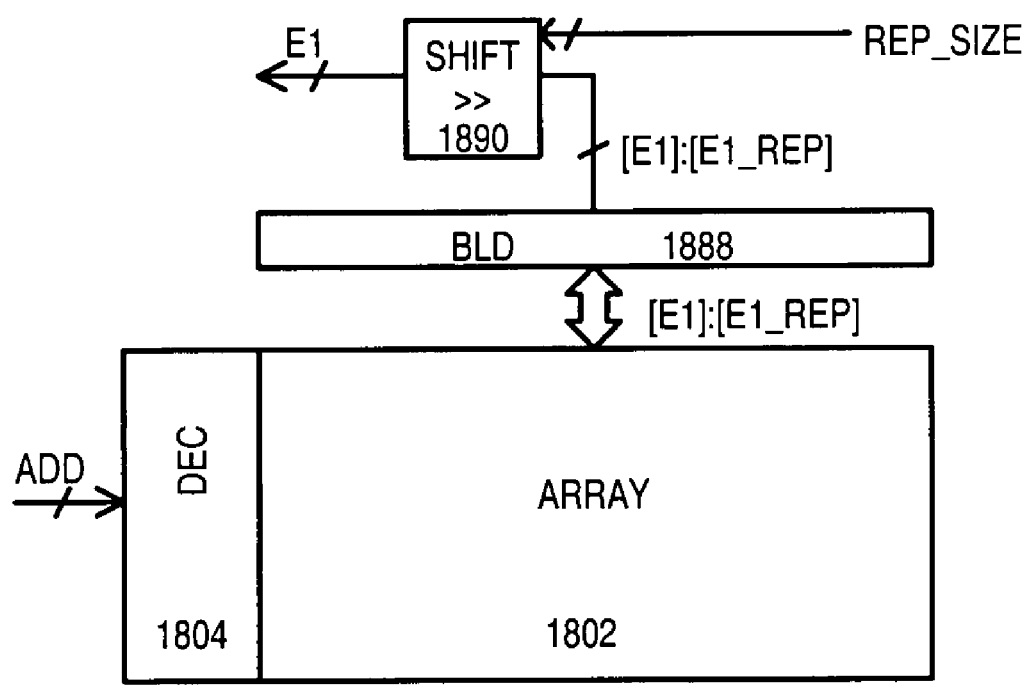
FIG. 18 is a block schematic diagram of a CAM device according to a tenth embodiment of the present invention.
Figure 19:
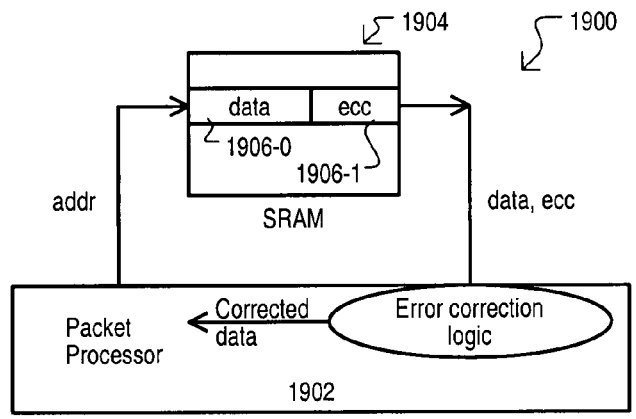
FIG. 19 is a block diagram of a conventional packet processing system providing error-correction with a static random access memory (SRAM).
Figure 20:
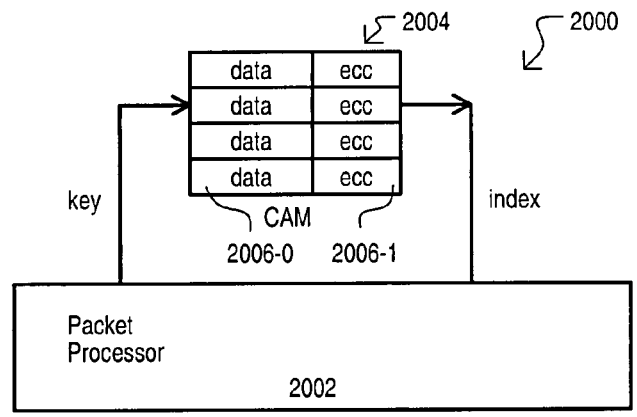
FIG. 20 is a block diagram of an approach like that of FIG. 18, applied to a conventional packet processing system with a CAM.
Figure 21:
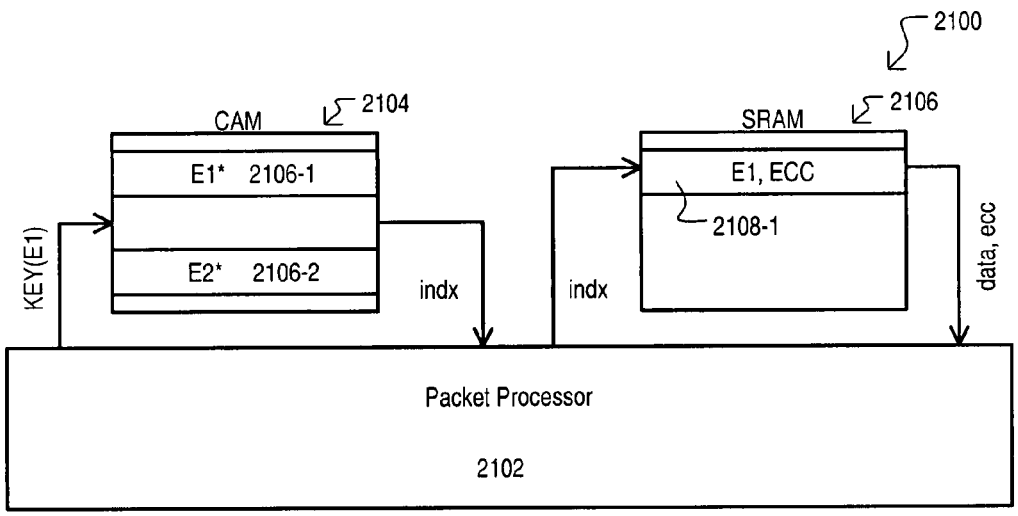
FIG. 21 is a block diagram of a conventional packet processing system including a CAM and SRAM that provides error detection.
Figure 22:
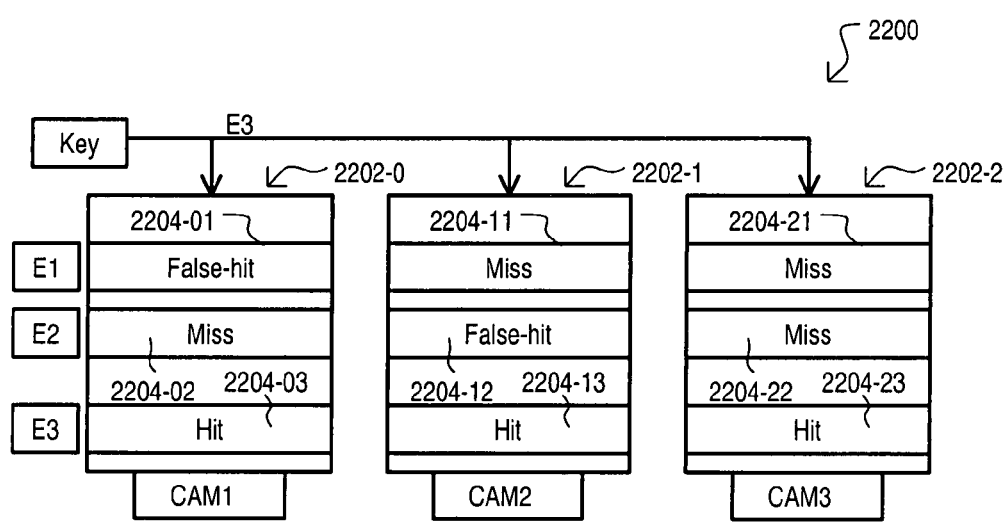
FIG. 22 is a block diagram of a conventional CAM based system that provides error correction.

Referring now to FIG. 18, a CAM device according to yet another embodiment is set forth in block schematic diagram and designated by the general reference character 1800. The arrangement of FIG. 18 shows read data path circuits for a CAM device employing error correction according to the various above-described techniques.

A CAM device 1800 can include some of the same components as FIG. 13. Accordingly, like components are referred to by the same reference character but with the first two digits being an "18" instead of "13".

A CAM device 1800 can include output data driver circuit 1888 and output data modifier circuit 1890. In a read operation, a CAM entry can be selected according to an address applied to a CAM address decoder. An appended data value ([E1]:[E1_REP]) stored in the entry can be driven by output data driver circuit 1888. An output data modifier circuit 1890 can remove replicated data portions (E1_REP) from such a value to provide only the entry value (E1).

In this way, a CAM device 1800 can provide a data value from an error correction data set.

While the above embodiments have shown CAM devices having various features, it is understood such features could be combined or omitted depending upon the features desired.

In addition, it is understood that in some CAM configurations a single entry may span multiple CAM rows. In such arrangements, a decrease in search speed can result. For example, if a search key is fully replicated (doubled) from 144 bits to 288 bits, and the largest searchable key size for the CAM in a single cycle is 144 bits, employing column expansion error correction will require two cycles per search. However, if the original entry size is 36 bits (so that it doubles to at most 72 bits), or at most 72 bits wide (so that it doubled to 144 bits) in a CAM that has the same search speed for 72 bit and 144 bit searches, there is no degradation in search speed.

Further, while memory devices have been described above as random access memories (RAM), and may preferably be static RAMs, alternate memory devices can be utilized for associated data and/or error correction data, including but not limited to dynamic RAMs, electrically erasable and programmable read-only-memories (EEPROMs) including flash EPROMs, as well as other nonvolatile memory devices such as magneto-resistive RAMs, and ferroelectric RAMs, as but a few examples.

In the above described embodiments, error correction schemes that can provide SRAM-like on-the-fly error correction scheme for CAMs that can protect against 1-bit errors over two rows of CAM entries, as well as a specific class of multi-bit clustered soft errors.

In particular embodiments, such error correction can be driven by software, with no change to a conventional CAM architecture.

It is also understood that the embodiments of the invention may be practiced in the absence of an element and or step not specifically disclosed. That is, an inventive feature of the invention can be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. A method of error correction for a content addressable memory (CAM), comprising:
   in a search operation,
   replicating at least a portion of a search key value to generate a replicated search key value,
   combining the search key value with the replicated search key value to produce an applied search key value using circuits internal to the CAM, and
   applying the applied search key value to the CAM as a comparand value.

2. The method of claim 1, wherein:
   replicating at least a portion of the search key value includes replicating the entire search key value to generate the replicated search key value.

3. The method of claim 1, wherein:
   replicating at least a portion of the search key value and applying the applied search key value are performed by circuits internal to the CAM.

4. The method of claim 1, wherein:
   the step of applying the applied search key value includes
   applying the applied search key value with a first global mask that masks a replicated search key portion of the applied search key value from a compare operation in the CAM, and
   applying the applied search key value with a second global mask that masks the search key portion of the applied search key value from a compare operation in the CAM.

5. The method of claim 1, wherein:
   the step of applying the applied search key value to the CAM includes applying the applied search key value in combination with a set select value that corresponds to at least one data set of a plurality of different data sets stored in the CAM.

6. The method of claim 1, further including:
   receiving a search result from the CAM in response to the application of the applied search key value, the search result including an index value if the search result indicates a match with a CAM entry; and
   accessing a memory that includes storage locations corresponding to entries within the CAM according to at least a portion of the index value.

7. The method of claim 6, wherein:
   the index value is a multi-bit value having a least significant bit (LSB); and
   accessing the memory includes accessing the memory without the LSB of the index value.

8. The method of claim 6, wherein:
   the memory comprises an associated data memory that stores an associated data value corresponding to each entry of the CAM.

9. The method of claim 6, wherein:
   the memory comprises an error correction memory that stores error correction data values corresponding to each entry of the CAM.

10. The method of claim 1, further including:
    in a write operation,
    replicating at least a portion of a write data value to generate a replicated write data value,
    combining the write data value with the replicated write data value to produce an applied write data value, and
    writing the applied write data value to a CAM address.

11. The method of claim 10, further including:
    incrementing the CAM address, and
    writing the applied write data value to the incremented CAM address.

12. The method of claim 1, further including:
    in a read operation reading from a CAM address to retrieve a CAM read data value having a data value portion and a replicated data value portion, the replicated data value portion being formed from at least a portion of a data value stored in the data value portion, and
    removing the replicated data value portion to produce an entry value.

13. An error correction program embodied on a non-transitory machine readable medium for providing error corrected search results from a content addressable memory (CAM), comprising:
    a replicating sequence for receiving a search key value and replicating at least a portion of the search key value to produce a replicated search key value;
    a combining sequence for combining the search key value with the replicated search key value to produce an applied search key value; and
    an application sequence for applying the applied search key value to the CAM as a comparand value.

14. The error correction program of claim 13, wherein:
the application sequence further includes
a mask selection sequence for selecting a first mask value that masks the replicated search key value portion of the applied search key value, and selecting a second mask value that masks the search key value portion of the applied search key value.

15. A content addressable memory (CAM) with error correction, comprising:
a CAM array having a plurality of entries, each entry including a first portion and a second portion;
a data replicator coupled to receive an input data value and output a replicated input data value that includes at least a portion of the input data value; and
a data driver having inputs coupled to the data replicator that outputs the data value and replicated input data value as an applied data value to the CAM array.

16. The CAM of claim 15, wherein:
the data replicator replicates an amount of the data value selected from: the entire input data value or a portion of the input data value.

17. The CAM of claim 15, wherein:
the CAM array, data replicator, and data driver are formed in a same integrated circuit substrate.

18. The CAM of claim 15, further including:
a global mask register having a plurality of storage locations for global mask values, each global mask value masking predetermined bits of the applied data value from a compare operation of the CAM array.

19. The CAM of claim 15, wherein:
the data driver comprises a compare data driver coupled to compare data lines of the CAM array, and the applied data value is an applied search key value.

20. The CAM of claim 15, wherein:
the data driver comprises a write data driver coupled to bit lines of the CAM array, and the applied data value is an applied write data value.

21. The CAM of claim 15, further including:
a memory interface circuit coupled to receive an index value from the CAM array in response to the application of a search key value as the applied data value, the memory interface circuit including an address application section that outputs at least a portion of the index value.

22. The CAM of claim 21, further including:
at least one addressable memory circuit comprising an associated data random access memory (RAM) having an address decoder coupled to receive the at least a portion of the index value, the associated data RAM having RAM locations for storing associated data values corresponding to each CAM entry.

23. The CAM of claim 21, further including:
at least one addressable memory circuit comprising an error correction data random access memory (RAM) having an address decoder coupled to receive the at least a portion of the index value, the error correction RAM having RAM locations for storing error correction data values corresponding to each CAM entry.

* * * * *